United States Patent
Mohanty

(10) Patent No.: US 10,256,110 B2
(45) Date of Patent: Apr. 9, 2019

(54) SELF-ALIGNED PATTERNING PROCESS UTILIZING SELF-ALIGNED BLOCKING AND SPACER SELF-HEALING

(71) Applicant: Tokyo Electron Limited, Minato-ku, Tokyo (JP)

(72) Inventor: Nihar Mohanty, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/661,825

(22) Filed: Jul. 27, 2017

(65) Prior Publication Data

US 2018/0061658 A1 Mar. 1, 2018

Related U.S. Application Data

(60) Provisional application No. 62/382,059, filed on Aug. 31, 2016.

(51) Int. Cl.
| | |
|---|---|
| *H01L 21/02* | (2006.01) |
| *H01L 21/027* | (2006.01) |
| *H01L 21/033* | (2006.01) |
| *H01L 21/311* | (2006.01) |
| *H01L 21/768* | (2006.01) |
| *H01L 21/3105* | (2006.01) |

(52) U.S. Cl.
CPC .... *H01L 21/31144* (2013.01); *H01L 21/0274* (2013.01); *H01L 21/02186* (2013.01); *H01L 21/0332* (2013.01); *H01L 21/0337* (2013.01); *H01L 21/31053* (2013.01); *H01L 21/31111* (2013.01); *H01L 21/76816* (2013.01)

(58) Field of Classification Search
CPC ......... H01L 21/02186; H01L 21/0337; H01L 21/0274; H01L 21/0332; H01L 21/31111; H01L 21/76816; H01L 21/31053; H01L 21/31144; H01L 21/76897
USPC .......................................................... 438/759
See application file for complete search history.

(56) References Cited

U.S. PATENT DOCUMENTS

| | | |
|---|---|---|
| 9,209,038 B2 | 12/2015 | Cantone et al. |
| 9,287,135 B1 | 3/2016 | Doris et al. |
| 9,524,878 B2 | 12/2016 | Peng |
| 9,564,446 B1 | 2/2017 | Weybright et al. |
| 9,620,380 B1 | 4/2017 | Dai et al. |
| 2013/0100743 A1* | 4/2013 | Lue .................... G11C 16/04 365/185.18 |

* cited by examiner

*Primary Examiner* — Jasmine J Clark
(74) *Attorney, Agent, or Firm* — Wood Herron & Evans LLP

(57) ABSTRACT

A multiple patterning process is provided with a self-aligned blocking (SAB) technique. The SAB technique trades off difficult overlay requirements for more manageable etch selectivity requirements between the various layers utilized for the patterning process. As disclosed herein, damage to sidewalls resulting from etching at the self-aligned block masking step may still occur. Damage is repaired by providing a plug layer that fills the areas of the damaged spacers. The plug layer may be the same material as forms the spacers. In this manner, the fill process provides a self-healing mechanism for damaged spacers.

20 Claims, 13 Drawing Sheets

SELF-ALIGNED PATTERNING PROCESS UTILIZING SELF-ALIGNED BLOCKING AND SPACER SELF-HEALING

This application claims priority to Provisional Patent Application No. 62/382,059, filed Aug. 31, 2016, entitled "Spacer Self-Healing Method;" the disclosure of which is expressly incorporated herein, in its entirety, by reference.

BACKGROUND

The present disclosure relates to the processing of substrates, such as for example, semiconductor substrates. In particular, it provides a novel method to pattern substrates utilizing self-aligned blocking and spacer self-healing techniques.

As geometries in substrate processing continue to shrink, the technical challenges to forming structures on substrates via photolithography techniques increase. This is particularly challenging for Back End of Line (BEOL) trench patterning where patterning demands of sub-30 nm pitches may exist.

A variety of techniques for addresses such challenges have been attempted. Use of extreme ultraviolet (EUV) lithography using wavelengths of 13.5 nm is one technique. However, EUV lithography raises numerous challenges including source power challenges. Another technique is directed self-assembly (DSA). However, DSA faces significant line placement roughness (LPR) challenges. Attempts have been made to achieve small pitches utilizing 193 nm lithography. Due to the limitations of 193 nm lithography, additional processing steps are required. One technique for achieving suitable photolithography for such pitches involves multiple patterning techniques to provide for pitch splitting. Such multiple patterning techniques have included self-aligned double patterning, self-aligned triple patterning and self-aligned quadruple patterning. These multiple patterning techniques may involve the utilization of sidewall spacers for defining structures at pitches that are less than the original photolithography pitch. Such techniques have allowed the extension of standard photolithography techniques without resort to EUV lithography or DSA.

For example, in double patterning techniques, sidewall spacers are utilized to increase the structure density on the substrate surface. A mandrel structure may be formed on the substrate through known photolithography techniques. Sidewall spacers may then be formed adjacent the mandrel. Removal of the originally patterned mandrel leaves the two sidewall spacers, thus forming two structures for each mandrel. Similarly, self-aligned triple and quadruple patterning techniques are known. Multiple patterning techniques generally include the use of multiple masking steps. The first step may be called the mandrel mask and the second step may be called the block mask. Together, the two masking steps form the desired pattern.

For the smallest pitches self-aligned quadruple patterning (SAQP) may be utilized. SAQP based trench patterning process functions with an area selective blocking process where the infinite lines are cut into chains or line ends cut, et cetera, to form the final desired trench layout. As pitches get smaller, the overlay requirements of the block pattern go beyond the overlay capability of the lithographic tools.

It would be desirable to provide a multiple patterning process integration technique that reduces the overlay requirements of the process.

SUMMARY

Described herein is an innovative method to implement multiple patterning techniques for the processing of substrates. In one embodiment, a multiple patterning process is provided with a self-aligned blocking (SAB) technique. The SAB technique trades off difficult overlay requirements for the more manageable etch selectivity requirements between the various layers utilized for the patterning process. As disclosed herein, damage to sidewalls resulting from etching at the self-aligned block masking step may occur. Damage is repaired by providing a plug layer that fills the areas of the damaged spacers. The plug layer may be the same material as forms the spacers. In this manner, the fill process provides a self-healing mechanism for damaged spacers.

In one embodiment, a method for multiple patterning lithography processing of a substrate is provided. The method may comprise providing a plurality of mandrels according to a first masking pattern and providing a plurality of sidewall spacers corresponding to the plurality of mandrels. The method may further comprise providing an etch stop layer underlying the plurality mandrels and the plurality of sidewall spacers. The method also includes forming a first plug layer over the plurality of mandrels and plurality of sidewall spacers. The method further includes providing a second masking pattern and etching the first plug layer according to the second masking pattern, the etching the first plug layer damaging at least some of the plurality of sidewall spacers to form damaged sidewall spacers, the etching the first plug layer exposing first regions of the etch stop layer in first spaces, a plurality of first portions of the first plug layer remaining after the etching the first plug layer. The method further comprises providing a second plug layer over the substrate, the second plug layer filling the first spaces, the second plug layer being formed of a similar material as the plurality of sidewall spacers are formed of, the filling the first spaces providing a self-healing effect to the damaged sidewall spacers. After providing the second plug layer over the substrate, the method includes removing the first portions of the first plug layer and removing the plurality of mandrels. After removing the first portions of the first plug layer and removing the plurality of mandrels, the method includes utilizing the plurality of sidewall spacers and portions of the second plug layer as a final masking pattern.

In another embodiment, a method for multiple patterning lithography processing of a substrate is provided. The method may comprise providing a plurality of mandrels according to a first masking pattern and providing a plurality of sidewall spacers corresponding to the plurality of mandrels. The method may further comprise etching a first plug layer according to a self-aligned blocking mask pattern, the etching the first plug layer damaging at least some of the plurality of sidewall spacers to create a plurality of damaged sidewall spacers, the etching the first plug layer removing the first plug layer from a plurality of first regions and leaving the first plug layer in a plurality of second regions, the plurality of damaged sidewall spacers being in the first regions. The method further includes providing a second plug layer over the substrate, the second plug layer filling the plurality of first regions, the second plug layer being formed of a similar material as the plurality of sidewall spacers are formed of, the filling the plurality of first regions providing a self-healing effect to the plurality of damaged sidewall spacers. After providing the second plug layer over the substrate, the method further comprises removing the first plug layer from the plurality of second regions. The method further comprises utilizing the plurality of sidewall spacers and portions of the second plug layer as a final masking pattern of the multiple patterning lithography processing.

In another embodiment, a method for multiple patterning lithography processing of a substrate is provided. The method may comprise providing a plurality of mandrels according to a first masking pattern and providing a plurality of sidewall spacers corresponding to the plurality of mandrels. The method may further comprise etching a first plug layer according to a self-aligned blocking mask pattern, the etching the first plug layer damaging at least some of the plurality of sidewall spacers to create a plurality of damaged sidewall spacers. The etching the first plug layer results in removing the first plug layer from a plurality of first regions and leaving the first plug layer in a plurality of second regions, the plurality of damaged sidewall spacers being in the first regions. The method may further comprise filling the plurality of first regions with a second plug layer formed of the same material as the plurality of sidewall spacers are formed of, the second plug layer healing the plurality of damaged sidewall spacers. The method further comprises planarizing the second plug layer. After planarizing the second plug layer, the method comprises removing the first plug layer from the plurality of second regions. The method further comprises utilizing the plurality of sidewall spacers and portions of the second plug layer remaining after the planarization of the second plug layer as a final masking pattern of the multiple patterning lithography processing.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
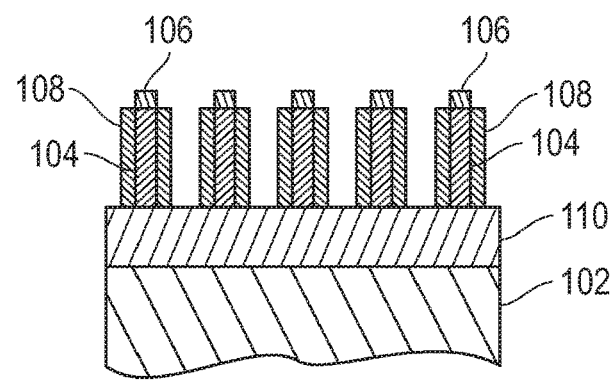
FIGS. 1A-10B illustrate cross-sectional and perspective views of exemplary structures formed on a substrate according to the techniques disclosed herein.

One embodiment of a multiple patterning photolithography process integration flow providing for self-healing of etch damage to spacers is shown in FIGS. 1A-10B. As shown and described below, the self-healing process utilizes an additional plug layer that allows for damage to spacers to be healed. As shown in FIG. 1A, a cross-section of a substrate 102 for a multiple patterning photolithography process is shown. As shown in FIG. 1A, the substrate 102 has been processed to provide mandrels 104 formed over an etch stop layer 110 and substrate 102. Substrate 102 may be any substrate for which the use of patterned features is desirable. For example, in one embodiment, substrate 102 may be a semiconductor substrate having one or more semiconductor processing layers formed thereon. In one embodiment, the substrate 102 may be a substrate that has been subjected to multiple semiconductor processing steps which yield a wide variety of structures and layers, all of which are known in the substrate processing art. In one embodiment, the patterning techniques disclosed herein may be utilized at a back end of line (BEOL) processing step. In a more particular embodiment, the patterning techniques are utilized during the formation of a BEOL trench. In one embodiment, mandrel caps 106 are also provided. It will be recognized by those in the art after reviewing the disclosure herein, that a mandrel cap is not required to utilize the techniques disclosed herein, or the mandrel caps 106 may be considered to be part of the mandrels 104. In one embodiment, mandrels 104 may be formed of amorphous silicon. However, the mandrels 104 may be formed of any of a wide variety of other materials, such as for example, silicon nitride or any number of other materials as is known in the art. In one embodiment, the mandrel caps 106 may be tetraethyl orthosilicate (TEOS) oxide, though other materials may be used, if a cap is utilized.

The techniques for forming mandrels 104 in a multiple patterning process are well known in the art. As known, mandrels 104 may be patterned by any of a number of photolithography or other patterning techniques. In one embodiment, mandrels 104 may be formed through a process which utilizes photolithography techniques to pattern a resist layer over a mandrel layer according to a mandrel mask pattern. Any of a variety of photolithography techniques may be utilized. One or more intervening layers may be used as part of the photolithography process between the mandrel layer and the resist layer, include spin on glass (SOG) layers, spin on carbon (SOC) layers, antireflective coatings, etc., all as is known in the art. The mandrels 104 may be the mandrels of any multiple pattern lithography process. In one embodiment, the mandrels 104 are mandrels of a self-aligned double patterning process. In another embodiment, the mandrels 104 are mandrels of a self-aligned triple patterning process. In one embodiment, the mandrels 104 are mandrels of a self-aligned quadruple patterning process. In the case of a self-aligned quadruple patterning process, the mandrels 104 may be the top mandrels and/or the bottom mandrels as the techniques shown herein may be utilized at either stage of the self-aligned quadruple process as would be recognized by those skilled in the art upon review of the techniques disclosed herein.

Sidewall spacers 108 may be formed on the sidewalls of the mandrels 104 as is known in the art. In one embodiment, the sidewall spacers 108 may be formed of a metal oxide. However, it will be recognized that any of a wide variety of materials may be utilized to form the sidewall spacers 108. As will be recognized after review of the full disclosure provided herein, a key criterion for selection of the sidewall spacer material is to match the characteristics of the material to the subsequent second plug layer disclosed below. In a particular embodiment, the sidewall spacers 108 are an atomic layer deposition (ALD) titanium oxide (TiO) having a $Ti_xO_y$ composition. In other embodiments, the sidewall spacers 108 may be formed of silicon dioxide, silicon nitride, zirconium oxide, etc. In one example with zirconium oxide spacers, the second plug layer may be a spin on silicon containing material.

As shown in FIG. 1A, the mandrels 104 and sidewall spacers 108 may be formed over an etch stop layer 110. In one example, etch stop layer 110 may be a silicon nitride layer. In another embodiment, the etch stop layer 110 may be a TEOS oxide. In will be recognized that the etch stop layer 110 may be formed of one or more layers of any of a wide variety of materials as is known in the art. Further, though shown as separate from the substrate 102, the etch stop layer 110 may be a layer of the substrate 102 itself.

Figure 1B:
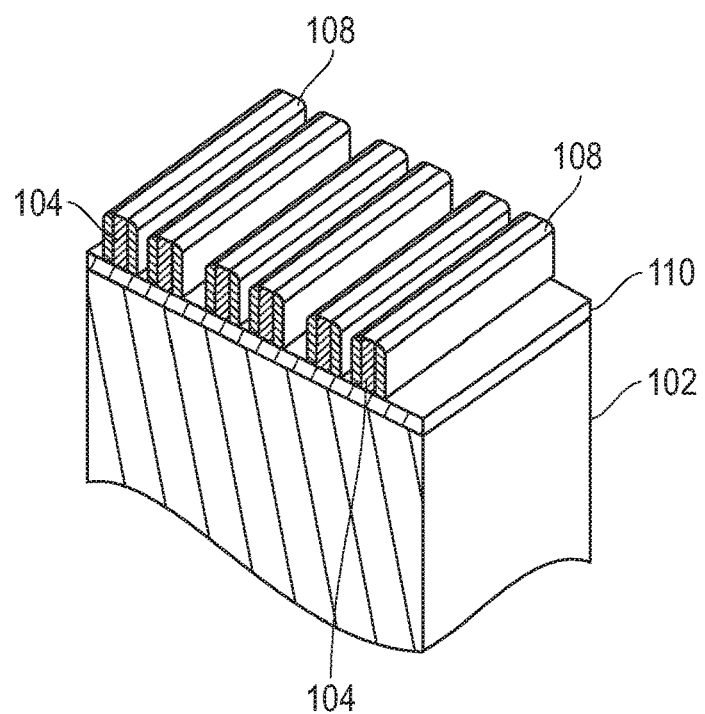

FIG. 1B illustrates an exemplary perspective view of the process step that is shown in the cross-section view of FIG. 1A.

Figure 2A:
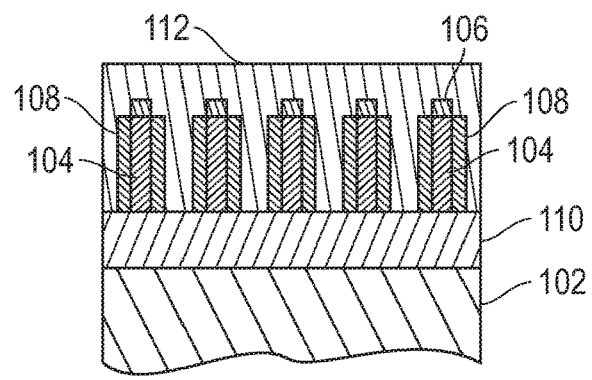
Figure 2B:
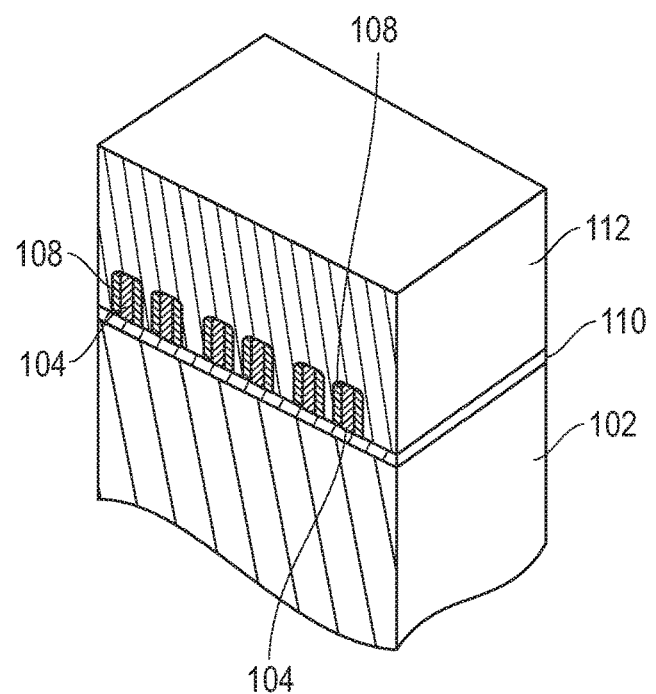

Next, the substrate processing proceeds to the stage as shown in the cross-section view of FIG. 2A and the perspective view of FIG. 2B. As shown, FIG. 2A, a first plug layer 112 may be formed over the substrate 102. The first plug layer 112 in one embodiment may be formed from a spin on glass. It will be recognized that the first plug layer may be formed from other materials and/or may be formed from the combination of one or more layers. In the embodiment shown, the first plug layer 112 fills the spacers between adjacent sidewall spacers 108. FIG. 1B illustrates an exemplary perspective view of the process step corresponding to that shown in the cross-section view of FIG. 1A.

Figure 3A:
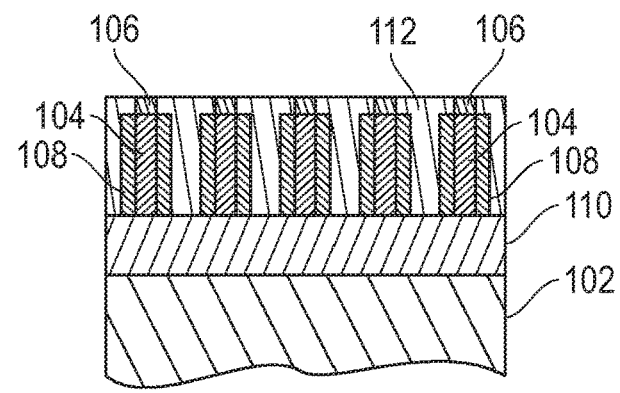
Figure 3B:
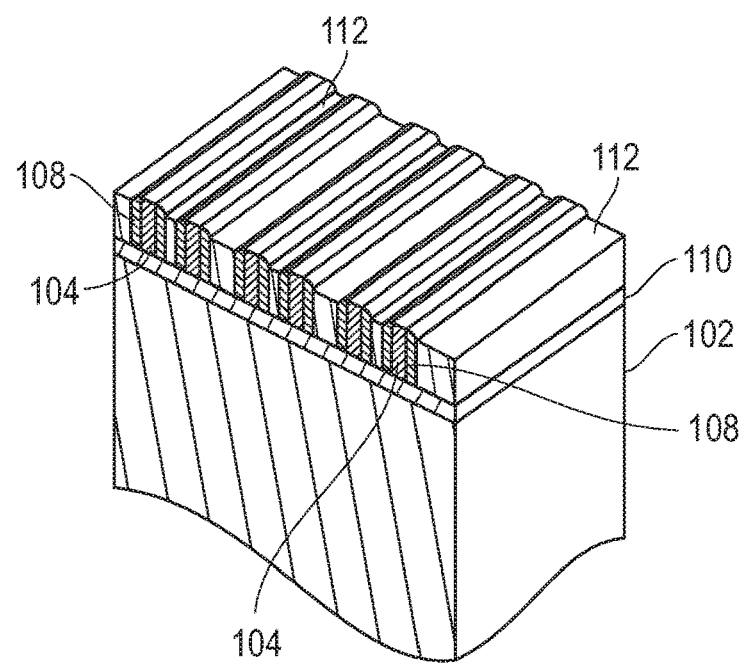

Next, the substrate processing proceeds to the stage shown in the cross-section view of FIG. 3A and the perspective view of FIG. 3B. As shown in FIG. 3A, the first plug layer 112 has been planarized. As shown in the figures, the planarization of the first plug layer 112 conforms to approximately the top of the stack of the mandrels 104 and mandrel caps 106. FIG. 2B illustrates an exemplary perspective view of the process step corresponding to that shown in the cross-section view of FIG. 2A.

Figure 4A:
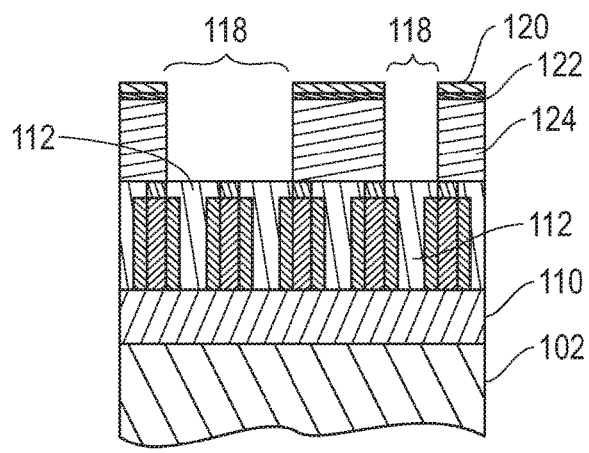
Figure 4B:
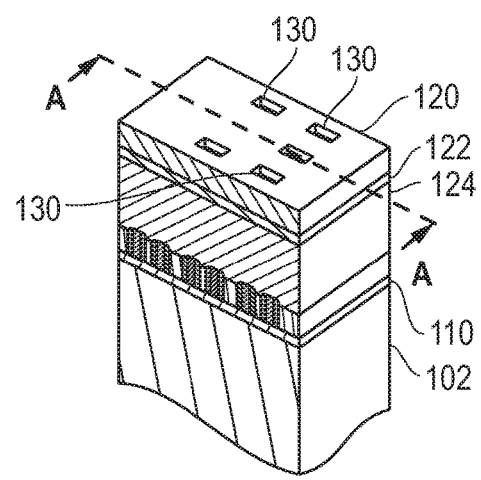

Next, the substrate processing proceeds to a self-aligned blocking (SAB) lithography process. The self-aligned blocking lithography process may include the use of a variety of layers to form a SAB pattern. In one exemplary embodiment, the layers may include a resist layer, an anti-reflective coating, and an optical planarization layer. It will be recognized that other layers and more or less layers may be utilized during the lithography process to form a SAB pattern on the substrate. A completed SAB lithography process for one exemplary process is shown in the cross-section view of FIG. 4A and the corresponding perspective view of FIG. 4B. In the example of FIGS. 4A and 4B, a spin on organic planarization layer 124 was formed across the substrate 102. Above the organic planarization layer 124 is an anti-reflective layer 122 and a SAB resist layer 120. As shown in FIGS. 4A and 4B, the SAB resist layer 120 has been patterned and the anti-reflective layer 122 and organic planarization layer 124 correspondingly etched. Spaces 118 may be formed in the pattern of the SAB resist layer 120 as shown in the FIG. 4A cross-section. When viewed from the top view of FIG. 4B, the spaces 118 correspond to the holes 130 of the SAB resist layer 120.

As will be seen from the further process steps described below, the mask used to pattern the SAB resist layer 120 is a dark field mask. According to the process provided herein, ultimately the etch stop layer 110 will be exposed in areas blocked by the SAB resist layer 120, and the etch stop layer 110 will be protected in the areas of the spaces 118 and holes 130.

Figure 4C:
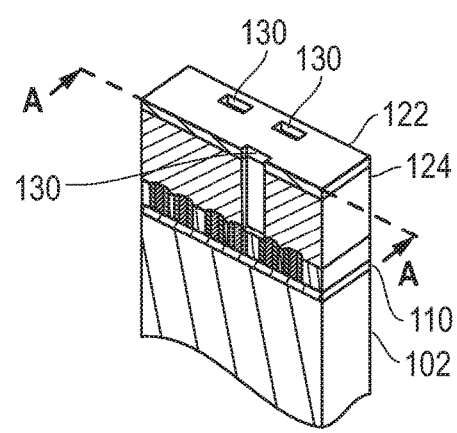

FIG. 4C is another perspective view of the structure shown in FIG. 4B. More particularly, FIG. 4C is a view along a cross-section line A-A shown in FIG. 4B. The perspective view of FIG. 4C provides a view through one of the holes 130. For illustration purposes, the resist layer 120 is not shown in FIG. 4C.

Figure 5A:
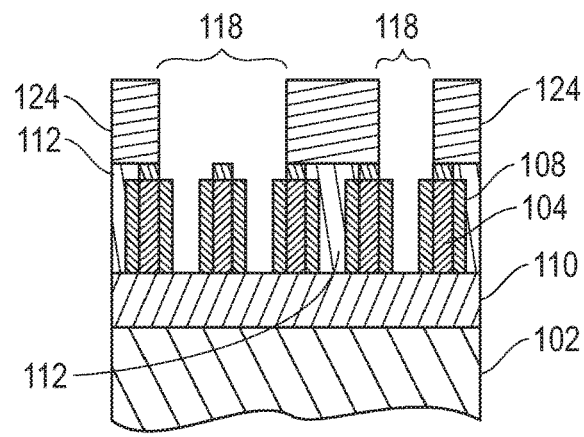
Figure 5B:
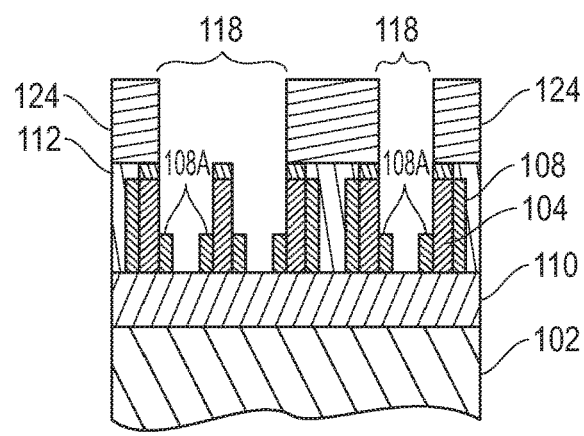
Figure 5C:
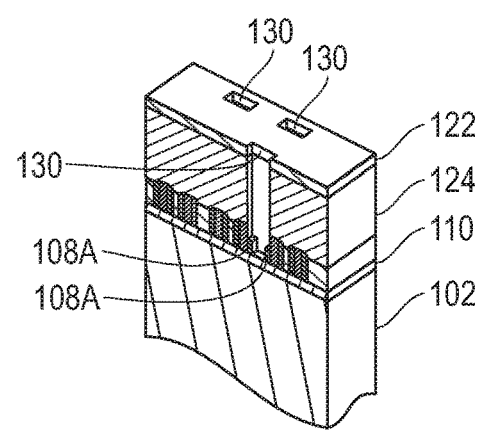

Processing next proceeds to a step as shown in FIGS. 5A, 5B, and 5C. More specifically, after etching the anti-reflective layer 122 and organic planarization layer 124, the exposed portions of the first plug layer 112 may be etched. In an ideal etch, a structure such as shown in FIG. 5A may result. As shown in FIG. 5A, the exposed portions of the first plug layer 112 have been completely etched with no damage to the exposed sidewall spacers 108. However, actual etch conditions will have limits on the etch selectivity between the material of the first plug layer 112 and the material of the sidewall spacers 108. Thus, due to the etch selectivity limitations, thickness of the materials, aspect ratios, needs for overetch, and process variations, damage to the sidewall spacers 108 may occur. Further, the very high aspect ratios of the to be etched at the SAB mask step often will require a high ion energy etch. The use of such high ion energy can greatly enhance the potential of damage to the sidewall spacers.

FIGS. 5B and 5C illustrate such damage. More particularly, as shown, the effects of the etch of the first plug layer 112 on the sidewalls may be significant. More particularly, damaged sidewall spacers 108A may result as shown. This damage will undesirably leave the mandrels 104 exposed to subsequent processing, thus hindering the self-aligned nature of the SAB masking step. As described in more detail below, the techniques provided herein provide a mechanism to heal such damage and retain the self-aligned benefits of the SAB masking step despite such damage.

Figure 6A:
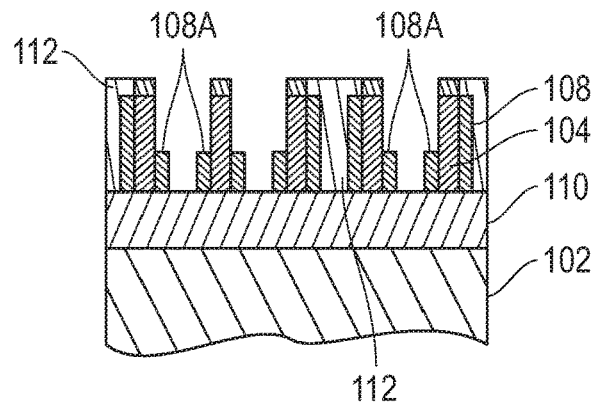
Figure 6B:
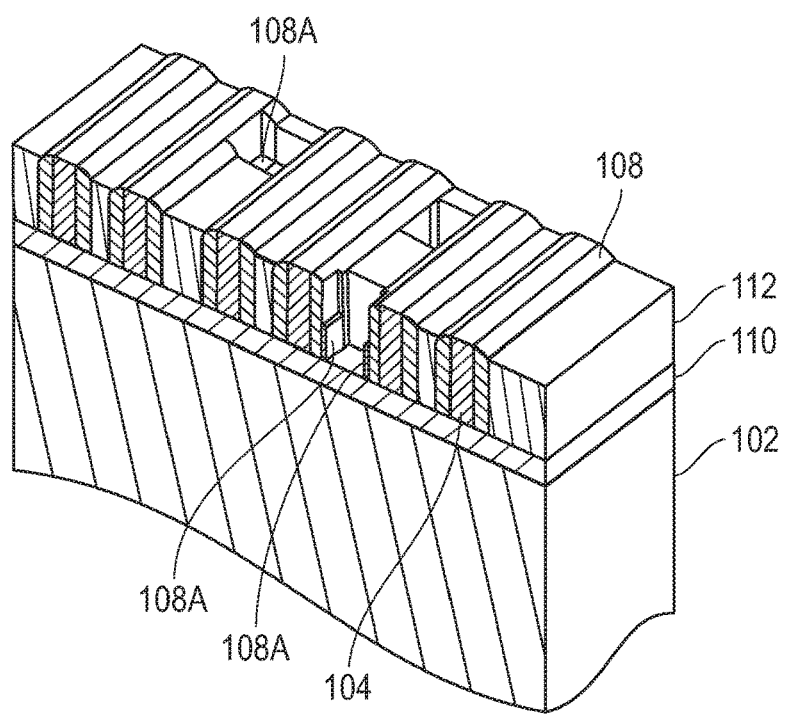

After, the processing as shown in FIGS. 5B and 5C, various layers (if remaining) of the SAB lithography steps may be stripped. Thus, the SAB resist layer 120, anti-reflective layer 122 and organic planarization layer 124 have been removed from the substrate 102 as shown in FIGS. 6A and 6B. It will be recognized that the perspective view of FIG. 6B corresponds to the cross-section of the perspective view of FIGS. 4C and 5C.

Figure 7A:
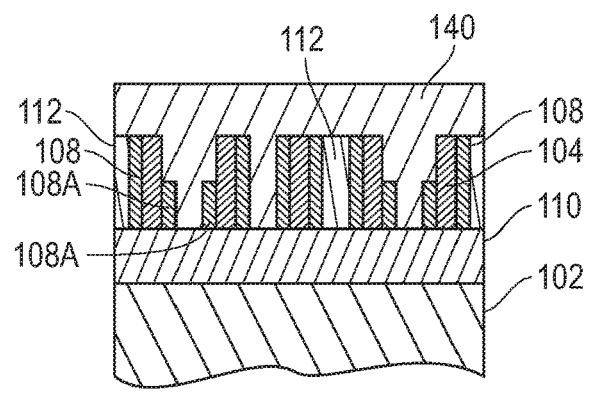
Figure 7B:
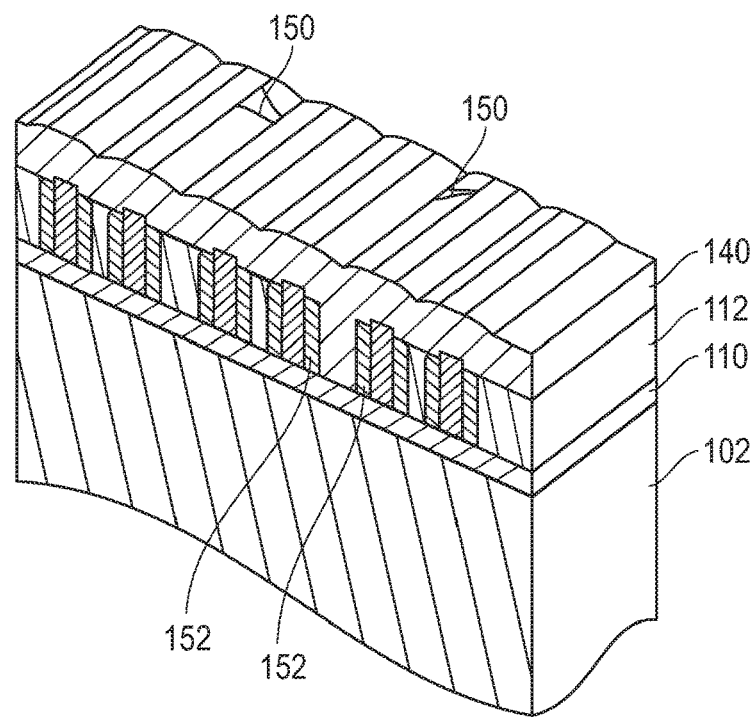

Processing then proceeds to the step shown in the cross-section view of FIG. 7A and perspective view of FIG. 7B. As shown in FIGS. 7A and 7B, a second plug layer 140 is provided across the substrate. As can be seen, the second plug layer 140 will fill the damaged areas of the sidewall spacers 108. As described herein, the second plug layer 140 may be formed from a material that is substantially similar to the sidewall spacers. For example, the material of the second plug layer 140 may have similar etch and electrical characteristics as the material of the sidewall spacers 108. In one embodiment, the second plug layer 140 and the sidewall spacers 108 may be formed of the same material. Thus, for example, in the embodiment described above in which the sidewall spacer 108 is $Ti_xO_y$, the second plug layer 140 may be a similar $Ti_xO_y$ composition. In one embodiment, both the sidewall spacer 108 and the second plug layer 140 are ALD $Ti_xO_y$. It will be recognized that other materials may be utilized and that the embodiments shown are merely exemplary. In this manner, the combination of the damaged sidewall spacers 108A and the second plug layer 140 forms a continuous layer along the sidewalls of the mandrels 104. For example, as shown in FIG. 7B, effectively a continuous sidewall formation 152 is provided. Artifacts of the locations of the damaged sidewalls 108A may be seen as shown as indentions 150 in FIG. 7B. However, as will be recognized upon review of the subsequent figures, such artifacts will not adversely impact subsequent processing.

Figure 8:
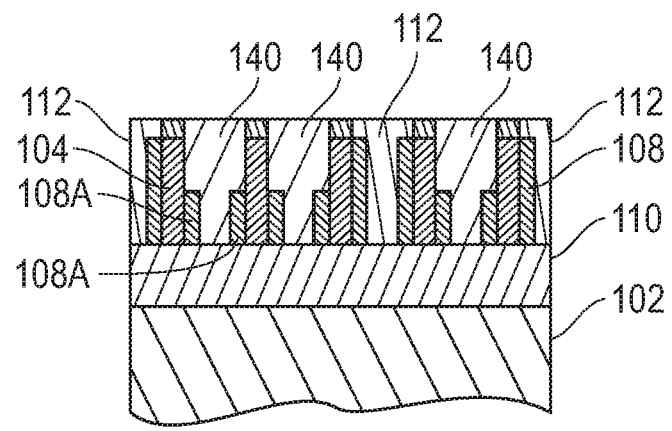
Figure 9:
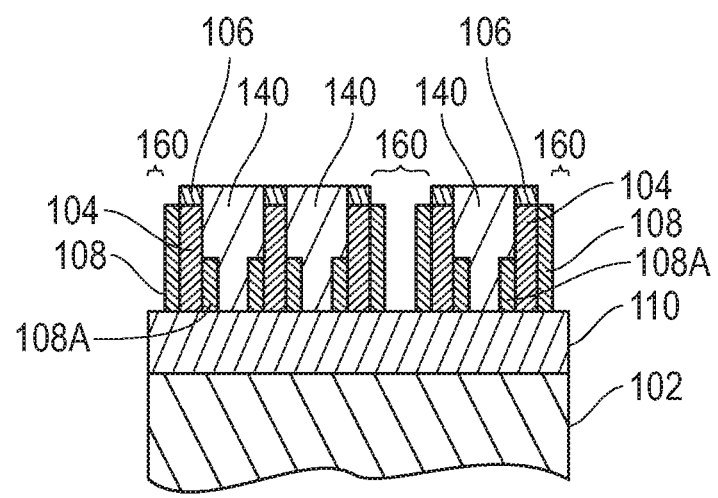
Figure 10A:
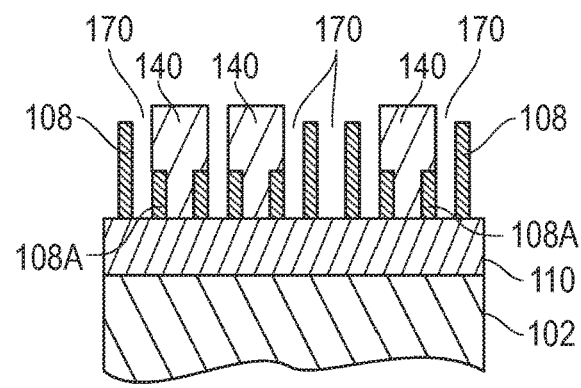
Figure 10B:
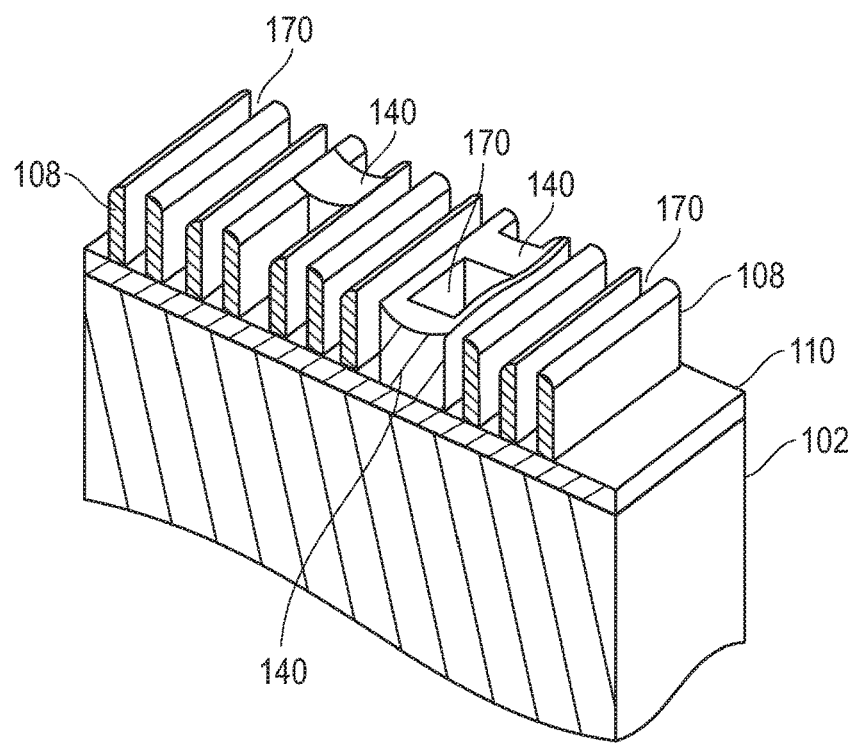

After formation of the second plug layer 140, the second plug layer 140 may be planarized or etched back as shown in FIG. 8. Processing may then proceed to the step shown in FIG. 9 where the remaining portions of the first plug layer 112 may be removed from locations 160 as shown. Due to the small aspect ratios of the layers being etched, the removal of the first plug layer 112 at this stage may be accomplished with a lower ion energy etch such that removal of the first plug layer 112 may be accomplished without significant etch damage to the now exposed sidewall spacers 108. It will be recognized that locations 160 correspond to the regions in which the SAB resist layer 120 remained after patterning. Processing may then proceed by removal of the mandrel caps 108 and mandrels 104 as shown in the cross-section view of FIG. 10A and perspective view of FIG. 10B. As shown in these figures, the final desired pattern may be etched by exposing additional portions of the etch stop layer 110. The regions 170 in which the etch stop layer 110 is exposed may then be utilized for provide a small pitch pattern (achieved via multiple patterning techniques). Further, any damaged caused to sidewall spacers may be self-healed through the use of the second plug layer 140. Thus, it will be recognized that the coordinated choice of the sidewall spacer material and the second plug layer material allows for self-healing of etch damage caused to the spacers, thus providing desirable process margin.

Subsequent processing may then transfer the resulting pattern to the etch stop layer and/or other layers of the substrate 102. For example, in one embodiment, the resulting pattern may be utilized as part of BEOL trench formation. In one embodiment, a 193 nm wavelength self-aligned quadruple patterning (SAQP) process may be utilized to achieve 5 nm BEOL trench patterning. Further, the self-healing sidewall spacer techniques provide process margin that allows for sidewall etch damage to be healed.

Accordingly, techniques provided herein enable relaxation of the selectivity requirements for the first plug layer etch by only requiring the selectivity to the mandrel material. Any damage to the spacers can be self-healed when the second plug layer is deposited. Such techniques can resolve issues in advanced node narrow pitch BEOL trench patterns. Benefits include enabling SAB integration for a 5 nm BEOL trench pattern, enabling self-healing of damage to the spacers, and improved yield and edge placement error by having perfect spacer profile and height.

Exemplary process flows for utilizing the techniques described herein are provided in FIGS. 2-4. It will be recognized that these process flows are merely exemplary and the techniques described herein may be utilized in other manners. Further, it will be recognized that additional steps may be added to the exemplary process flows while still utilizing the advantageous benefits of the techniques disclosed herein. Additionally, it will be recognized by those skilled in the art that various steps of the process flows may be performed together or in combination, and thus, each step of the process flows is not limited to being a separate independent process step. In general, these steps can be performed in any suitable order. Additionally, although each of the different features, techniques, configurations, etc. may be discussed in different places of this disclosure, it is intended that each of the concepts can be executed independently of each other or in combination with each other. Accordingly, the disclosed techniques can be embodied and viewed in many different ways.

Figure 11A:
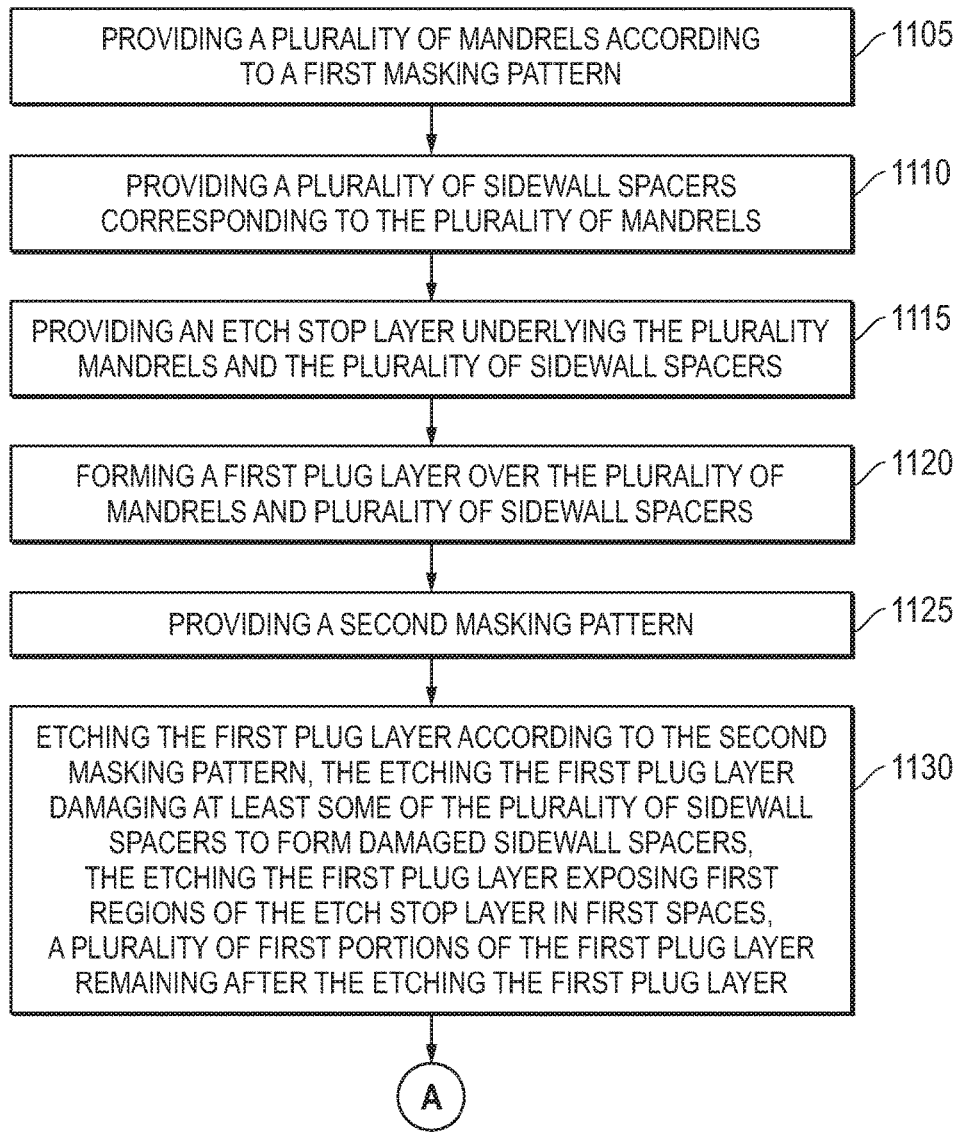
FIGS. 11A and 11B illustrate an exemplary process flow for one embodiment of the substrate processing techniques disclosed herein.
Figure 11B:
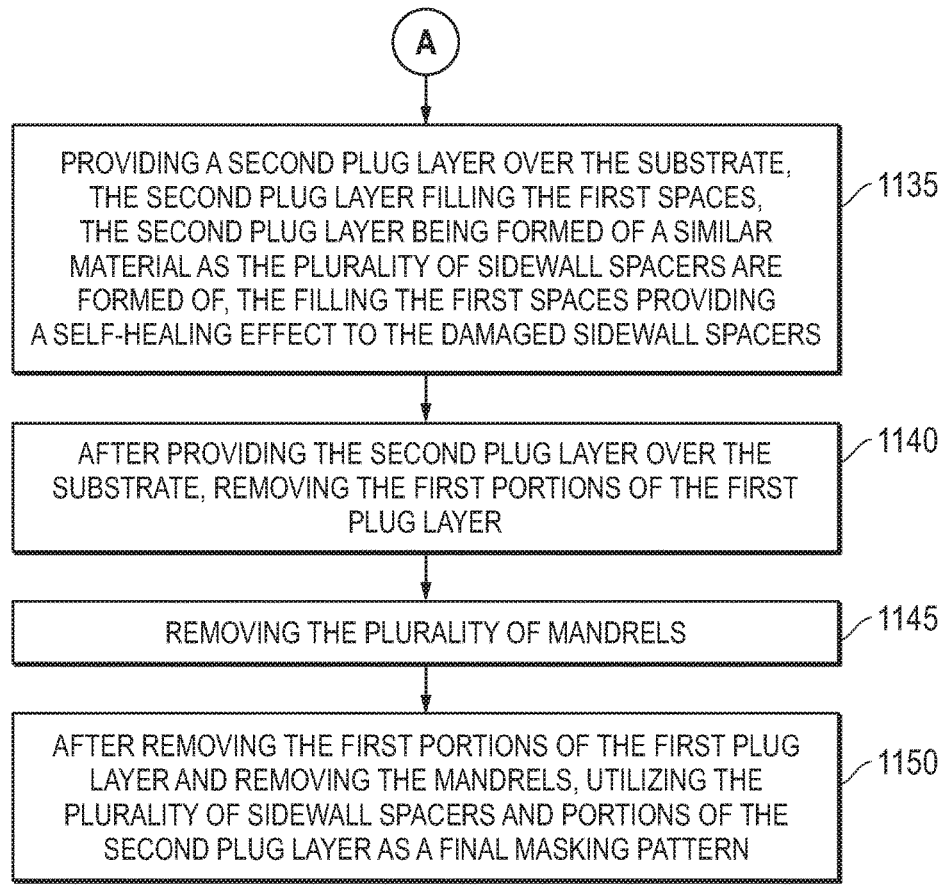

FIGS. 11A and 11B illustrate a method for multiple patterning lithography processing of a substrate. The method may include a step 1105 of providing a plurality of mandrels according to a first masking pattern and a step 1110 of providing a plurality of sidewall spacers corresponding to the plurality of mandrels. The method may further include a step 1115 of providing an etch stop layer underlying the plurality mandrels and the plurality of sidewall spacers. The method includes, at step 1120, forming a first plug layer over the plurality of mandrels and plurality of sidewall spacers. The method then proceeds to providing a second masking pattern, at step 1125. The method then provides for, at step 1130, etching the first plug layer according to the second masking pattern, the etching the first plug layer damaging at least some of the plurality of sidewall spacers to form damaged sidewall spacers. The etching the first plug layer also exposes first regions of the etch stop layer in first spaces, a plurality of first portions of the first plug layer remaining after the etching the first plug layer. Then, at step 1135, the method includes providing a second plug layer over the substrate, the second plug layer filling the first spaces, the second plug layer being formed of a similar material as the plurality of sidewall spacers are formed of, the filling the first spaces providing a self-healing effect to the damaged sidewall spacers. After providing the second plug layer over the substrate, the method proceeds to step 1140 for removing the first portions of the first plug layer. The method further includes removing the plurality of mandrels at step 1145. After removing the first portions of the first plug layer and removing the plurality of mandrels, the method proceeds to step 1150 for utilizing the plurality of sidewall spacers and portions of the second plug layer as a final masking pattern.

Figure 12:
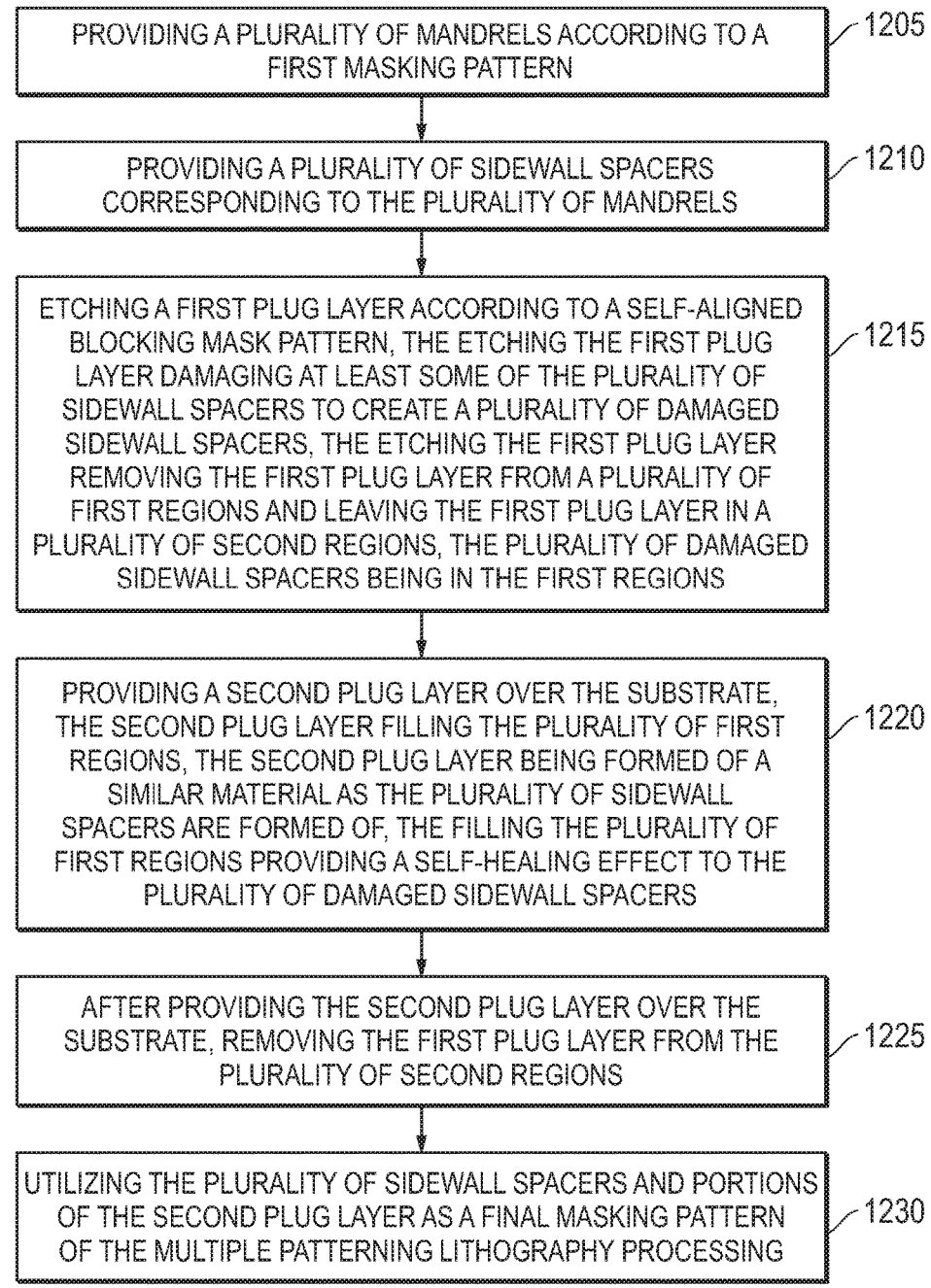
FIG. 12 illustrates another exemplary process flow for one embodiment of the substrate processing techniques disclosed herein.

FIG. 12 illustrates a method for multiple patterning lithography processing of a substrate. The method includes providing a plurality of mandrels according to a first masking pattern as step 1205 and providing a plurality of sidewall spacers corresponding to the plurality of mandrels at step 1210. The method further includes, at step 1215, etching a first plug layer according to a self-aligned blocking mask pattern, the etching the first plug layer damaging at least some of the plurality of sidewall spacers to create a plurality of damaged sidewall spacers, the etching the first plug layer removing the first plug layer from a plurality of first regions and leaving the first plug layer in a plurality of second regions, the plurality of damaged sidewall spacers being in the first regions. The method then proceeds to step 1220 for providing a second plug layer over the substrate, the second plug layer filling the plurality of first regions, the second plug layer being formed of a similar material as the plurality of sidewall spacers are formed of, the filling the plurality of first regions providing a self-healing effect to the plurality of damaged sidewall spacers. After providing the second plug layer over the substrate, the method includes step 1225 for removing the first plug layer from the plurality of second regions. Then the method includes, at step 1230, utilizing the plurality of sidewall spacers and portions of the second plug layer as a final masking pattern of the multiple patterning lithography processing.

Figure 13:
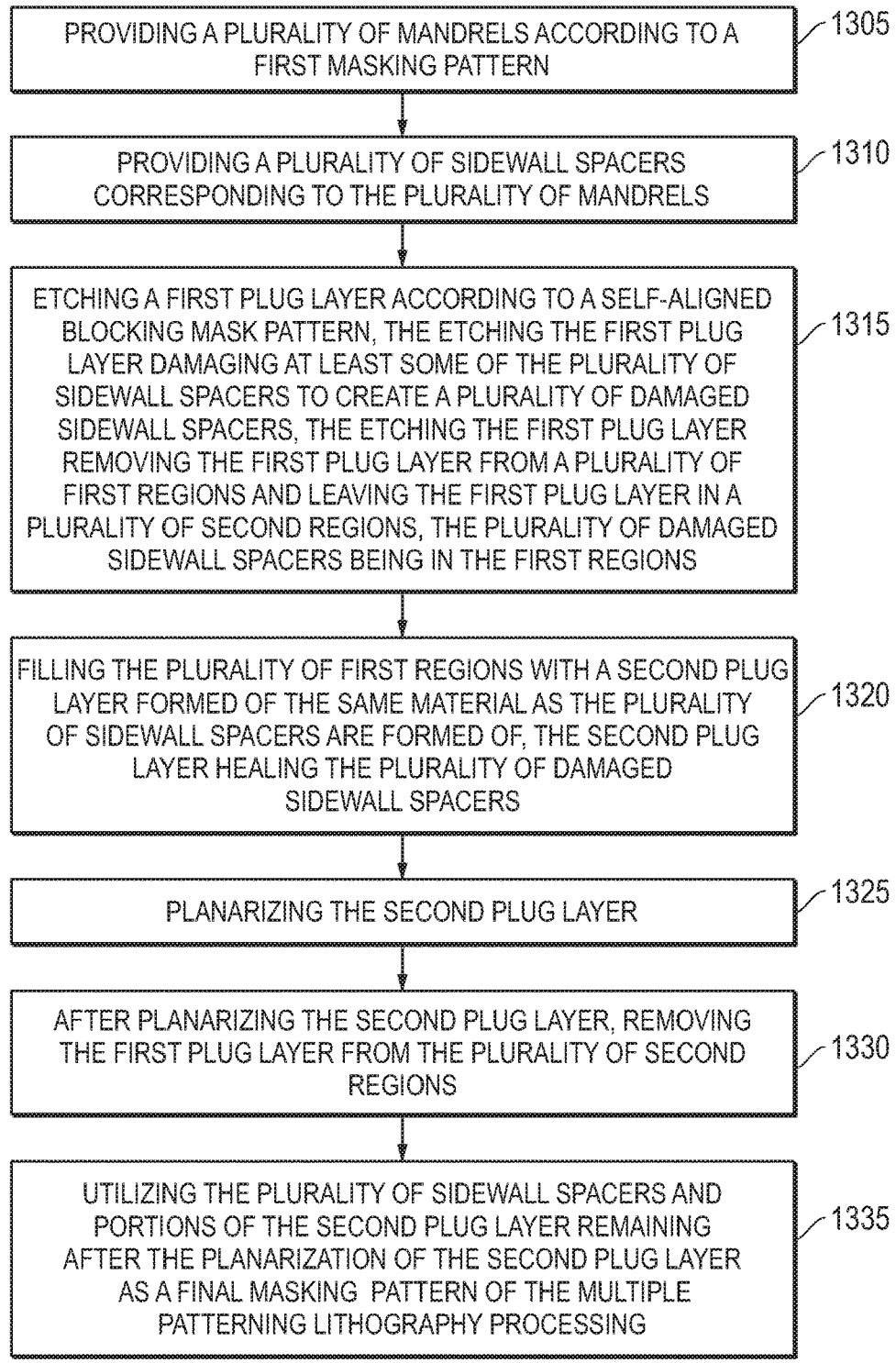
FIG. 13 illustrates another exemplary process flow for one embodiment of the substrate processing techniques disclosed herein.

FIG. 13 illustrates a method for multiple patterning lithography processing of a substrate. The method includes providing a plurality of mandrels according to a first masking pattern at step 1305 and providing a plurality of sidewall spacers corresponding to the plurality of mandrels at step 1310. The method then includes, at step 1315, etching a first plug layer according to a self-aligned blocking mask pattern, the etching the first plug layer damaging at least some of the plurality of sidewall spacers to create a plurality of damaged sidewall spacers, the etching the first plug layer removing the first plug layer from a plurality of first regions and leaving the first plug layer in a plurality of second regions, the plurality of damaged sidewall spacers being in the first regions. The method then proceeds to step 1320 for filling the plurality of first regions with a second plug layer formed of the same material as the plurality of sidewall spacers are formed of, the second plug layer healing the plurality of damaged sidewall spacers. Planarizing the second plug layer occurs at step 1325. After planarizing the second plug layer, the method includes, at step 1330, removing the first plug layer from the plurality of second regions. Finally, the method includes, at step 1335 utilizing the plurality of sidewall spacers and portions of the second plug layer remaining after the planarization of the second plug layer as a final masking pattern of the multiple patterning lithography processing.

It will be recognized that many of the layers, and the materials that comprise the layers, that are described herein are merely exemplary. Thus, other materials may be utilized. Further, it will be recognized that the self-healing techniques described herein may be implemented without even all of the exemplary layers shown herein. It will be also recognized that the substrate 102 may be comprised of one or many layers. For example, the substrate 102 may be a semiconductor wafer that has many process layers formed on or in the semiconductor wafer. Thus, for example, the substrate 102 may be a semiconductor wafer at any process step in a semiconductor processing flow. For example, the substrate 102 may comprise a semiconductor wafer and all of its accompanying layers formed up to any particular process step. Further, it will be recognized that the various process layers and structures shown may be utilized with additional intervening process layers and coatings as would be understood by those in the art. Thus, it will be recognized that the use of a self-aligned multiple patterning process in which a self-healing spacer is provided may be accomplished within a wide variety of process flows, all of which may advantageously benefit from the characteristics an organic spacer provides.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. However, various operations may be combined. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" as used herein generically refers to an object being processed in accordance with the techniques described. The substrate may include any material portion or structure of a device, particularly a semiconductor or other electronics device, and may, for example, be a base substrate structure, such as a semiconductor wafer, or a layer on or overlying a base substrate structure such as a thin or thick film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for multiple patterning lithography processing of a substrate, comprising:
    providing a plurality of mandrels according to a first masking pattern;
    providing a plurality of sidewall spacers, each sidewall spacer positioned on a sidewall surface of one of the plurality of mandrels;
    providing an etch stop layer underlying the plurality mandrels and the plurality of sidewall spacers;
    forming a first plug layer over the plurality of mandrels and the plurality of sidewall spacers;
    providing a second masking pattern;
    etching the first plug layer according to the second masking pattern to remove a plurality of first portions of the first plug layer to expose first regions of the etch stop layer in first spaces with a plurality of second portions of the first plug layer remaining, wherein the etching the first plug layer results in damage to at least some of the plurality of sidewall spacers adjacent the first spaces thereby forming damaged sidewall spacers;
    providing a second plug layer over the substrate, the second plug layer filling the first spaces and being formed of a similar material as the plurality of sidewall spacers are formed of to provide a self-healing effect to the damaged sidewall spacers;
    after providing the second plug layer over the substrate, removing the second portions of the first plug layer;
    removing the plurality of mandrels; and
    after removing the second portions of the first plug layer and removing the plurality mandrels, utilizing the plurality of sidewall spacers and portions of the second plug layer as a final masking pattern for etching the substrate.

2. The method of claim 1, the plurality of sidewall spacers and the second plug layer being formed of a same material.

3. The method of claim 2, the same material being a metal oxide.

4. The method of claim 3, the metal oxide being $Ti_xO_y$.

5. The method of claim 2, the second masking pattern being a self-aligned blocking mask.

6. The method of claim 2, the final masking pattern being a BEOL trench pattern.

7. The method of claim 1, the multiple patterning lithography process being a self-aligned quadruple patterning process wherein the plurality of mandrels are sidewall spacers formed from an initial mandrel pattern and wherein the final masking pattern has a quadrupled pitch density compared to a pitch density of the initial mandrel pattern.

8. The method of claim 7, the final masking pattern being a BEOL trench pattern.

9. The method of claim 8, the plurality of sidewall spacers and the second plug layer being formed of a same material.

10. A method for multiple patterning lithography processing of a substrate, comprising:
   providing a plurality of mandrels according to a first masking pattern;
   providing a plurality of sidewall spacers, each sidewall spacer positioned on a sidewall surface of one of the plurality of mandrels;
   etching a first plug layer according to a self-aligned blocking mask pattern to remove the first plug layer from a plurality of first regions and to leave the first plug layer in a plurality of second regions, wherein the etching the first plug layer results in damage to at least some of the plurality of sidewall spacers thereby creating a plurality of damaged sidewall spacers in the first regions;
   providing a second plug layer over the substrate, the second plug layer filling the plurality of first regions and being formed of a similar material as the plurality of sidewall spacers are formed of to provide a self-healing effect to the plurality of damaged sidewall spacers;
   after providing the second plug layer over the substrate, removing the first plug layer from the plurality of second regions; and
   utilizing the plurality of sidewall spacers and portions of the second plug layer as a final masking pattern of the multiple patterning lithography processing for etching the substrate.

11. The method of claim 10, further comprising removing the plurality of mandrels after removing the first plug layer from the plurality of second regions but prior to utilizing the plurality of sidewall spacers and the portions of the second plug layer as the final masking pattern.

12. The method of claim 10, the plurality of sidewall spacers and the second plug layer being formed of a same material.

13. The method of claim 12, the same material being a metal oxide.

14. The method of claim 13, the metal oxide being $Ti_xO_y$.

15. The method of claim 12, the final masking pattern being a BEOL trench pattern.

16. The method of claim 15, the multiple patterning lithography processing being a self-aligned quadruple patterning process wherein the plurality of mandrels are sidewall spacers formed from an initial mandrel pattern and wherein the final masking pattern has a quadrupled pitch density compared to a pitch density of the initial mandrel pattern.

17. A method for multiple patterning lithography processing of a substrate, comprising:
   providing a plurality of mandrels according to a first masking pattern;
   providing a plurality of sidewall spacers, each sidewall spacer positioned on a sidewall surface of one of the plurality of mandrels;
   etching a first plug layer according to a self-aligned blocking mask pattern to remove the first plug layer from a plurality of first regions and to leave the first plug layer in a plurality of second regions, wherein the etching the first plug layer results in damage to at least some of the plurality of sidewall spacers thereby creating a plurality of damaged sidewall spacers in the first regions;
   filling the plurality of first regions with a second plug layer formed of the same material as the plurality of sidewall spacers are formed of, the second plug layer healing the plurality of damaged sidewall spacers;
   planarizing the second plug layer;
   after planarizing the second plug layer, removing the first plug layer from the plurality of second regions; and
   utilizing the plurality of sidewall spacers and portions of the second plug layer remaining after the planarizing of the second plug layer, as a final masking pattern of the multiple patterning lithography processing for etching the substrate.

18. The method of claim 17, further comprising removing the plurality of mandrels after removing the first plug layer from the plurality of second regions but prior to utilizing the plurality of sidewall spacers and the portions of the second plug layer as the final masking pattern.

19. The method of claim 17, the plurality of sidewall spacers and the second plug layer being formed of a metal oxide.

20. The method of claim 19, the metal oxide being $Ti_xO_y$.

* * * * *

UNITED STATES PATENT AND TRADEMARK OFFICE
CERTIFICATE OF CORRECTION

| | | |
|---|---|---|
| PATENT NO. | : 10,256,110 B2 | Page 1 of 1 |
| APPLICATION NO. | : 15/661825 | |
| DATED | : April 9, 2019 | |
| INVENTOR(S) | : Nihar Mohanty | |

It is certified that error appears in the above-identified patent and that said Letters Patent is hereby corrected as shown below:

In the Specification

Column 2, Line 19, change "stop layer underlying the plurality mandrels and the plurality" to --stop layer underlying the plurality of mandrels and the plurality--.

Column 6, Lines 8-9, change "Further, the very high aspect ratios of the to be etched at the SAB mask step often" to --Further, the very high aspect ratios to be etched at the SAB mask step often--.

Column 7, Lines 8-9, change "The regions 170 in which the etch stop layer 110 is exposed may then be utilized for provide a small" to --The regions 170 in which the etch stop layer 110 is exposed may then be utilized to provide a small--.

Column 7, Line 11, change "Further, any damaged caused to" to --Further, any damage caused to--.

Column 7, Line 62, change "plurality mandrels and the plurality of" to --plurality of mandrels and the plurality of--.

In the Claims

Column 10, Lines 22-23, Claim 1, change "providing an etch stop layer underlying the plurality mandrels and the plurality of" to --providing an etch stop layer underlying the plurality of mandrels and the plurality of--.

Column 10, Line 44, Claim 1, change "and removing the plurality mandrels," to --and removing the plurality of mandrels,--.

Signed and Sealed this
Ninth Day of July, 2019

Andrei Iancu
*Director of the United States Patent and Trademark Office*